(12) United States Patent
Kobayashi (10) Patent No.: US 7,665,009 B2
(45) Date of Patent: Feb. 16, 2010

(54) DEVICE, DATA SECTOR, METHOD OF PROCESSING DATA, AND SIGNAL-BEARING MEDIUM EMBODYING PROGRAM OF DEVICE

(75) Inventor: Eiji Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 637 days.

(21) Appl. No.: 11/432,525

(22) Filed: May 12, 2006

(65) Prior Publication Data

US 2006/0282754 A1 Dec. 14, 2006

(30) Foreign Application Priority Data

May 17, 2005 (JP) ............... 2005-143403

(51) Int. Cl.
*H03M 13/00* (2006.01)
(52) U.S. Cl. .................................... 714/758
(58) Field of Classification Search ............... 714/752, 714/758, 763, 769, 800
See application file for complete search history.

(56) References Cited

U.S. PATENT DOCUMENTS

| 4,516,201 | A | * | 5/1985 | Warren et al. | ............... 709/234 |
| 4,698,810 | A | * | 10/1987 | Fukuda et al. | .............. 714/758 |
| 4,949,342 | A | * | 8/1990 | Shimbo et al. | .............. 714/769 |
| 6,367,048 | B1 | * | 4/2002 | McAuliffe et al. | .......... 714/758 |
| 7,246,303 | B2 | * | 7/2007 | Bansal et al. | ............... 714/800 |

FOREIGN PATENT DOCUMENTS

JP 8-138391 5/1996

* cited by examiner

*Primary Examiner*—Shelly A Chase
(74) *Attorney, Agent, or Firm*—McGinn IP Law Group, PLLC (57) ABSTRACT

A device for processing data read from a memory, the data including a word and a parity element with respect to the word, the device including a data recovery circuit that corrects error data in the word using a correction code generated from the parity element.

19 Claims, 12 Drawing Sheets

ERROR BYTE DESIGNATOR CIRCUIT

| | | | | | | | | | |
|---|---|---|---|---|---|---|---|---|---|
| WORD0 | D0 | D1 | D2 | D3 | D4 | D5 | D6 | D7 | P0 |
| WORD1 | D8 | D9 | D10 | D11 | D12 | D13 | D14 | D15 | P1 |
| WORD2 | D16 | D17 | D18 | D19 | D20 | D21 | D22 | D23 | P2 |
| | ⋮ | ⋮ | ⋮ | ⋮ | ⋮ | ⋮ | ⋮ | ⋮ | ⋮ |
| WORD (n) | $D_{(8n)}$ | $D_{(8n+1)}$ | $D_{(8n+2)}$ | $D_{(8n+3)}$ | $D_{(8n+4)}$ | $D_{(8n+5)}$ | $D_{(8n+6)}$ | $D_{(8n+7)}$ | $P_{(n)}$ |
| | ⋮ | ⋮ | ⋮ | ⋮ | ⋮ | ⋮ | ⋮ | ⋮ | ⋮ |
| WORD63 | D504 | D505 | D506 | D507 | D508 | D509 | D510 | D511 | P63 |
| WORD64 | CRC0 | CRC1 | CRC2 | CRC3 | CRC4 | CRC5 | CRC6 | CRC7 | P64 |

FIG. 9

| | | | | | |
|---|---|---|---|---|---|
| WORD0 | D0 | D1 | D2 | D3 | P0 |
| WORD1 | D4 | D5 | D6 | D7 | P1 |
| WORD2 | D8 | D9 | D10 | D11 | P2 |
| | ⋮ | ⋮ | ⋮ | ⋮ | ⋮ |
| WORD (n) | $D_{(4n)}$ | $D_{(4n+1)}$ | $D_{(4n+2)}$ | $D_{(4n+3)}$ | $P_{(n)}$ |
| | ⋮ | ⋮ | ⋮ | ⋮ | ⋮ |
| WORD127 | D508 | D509 | D510 | D511 | P127 |
| WORD128 | CRC0 | CRC1 | CRC2 | CRC3 | P128 |

FIG. 10

|  | D0 | D1 | D2 | D3 | D4 | D5 | D6 | D7 | | P0 |
|---|---|---|---|---|---|---|---|---|---|---|
| WORD 0 | | | | | | | | | ↑ PARITY CALCULATION | |
| WORD 1 | D8 | D9 | D10 | D11 | D12 | D13 | D14 | D15 | | P1 |
| WORD 2 | D16 | D17 | D18 | D19 | D20 | D21 | D22 | D23 | | P2 |
| ... | .. | .. | .. | .. | .. | .. | .. | .. | | .. |
| WORD (n) | D(8n) | D(8n+1) | D(8n+2) | D(8n+3) | D(8n+4) | D(8n+5) | D(8n+6) | D(8n+7) | | P(n) |
| ... | .. | .. | .. | .. | .. | .. | .. | .. | | .. |
| WORD 63 | D504 | D505 | D506 | D507 | D508 | D509 | D510 | D511 | | P63 |
| WORD64 | CRC0 | CRC1 | CRC2 | CRC3 | CRC4 | CRC5 | CRC6 | CRC7 | | P64 |

CRC CALCULATION $P(n) = D(wn+0) + D(wn+1) + D(wn+2) + \ldots + D(wn+k)$

P : PARITY ELEMENT
D : DATA ELEMENT
+ : EXOR CALCULATION
k : DATA ELEMENT NUMBER IN A WORD (k=0,1,2,...(w-1))
n : WORD NUMBER (n=0,1,2,...64)
w : THE NUMBER OF BYTES PER ONE WORD (w=8)

$CRC(k) = D(w*0+k) @ D(w*1+k) @ D(w*2+k) @ \ldots @ D(wn+k)$

CRC : CRC ELEMENT
D : DATA ELEMENT
@ : CRC CALCULATION
k : DATA ELEMENT NUMBER IN A WORD (k=0,1,2,...(w-1))
n : WORD NUMBER (n=0,1,2,...64)
w : THE NUMBER OF BYTES PER ONE WORD (w=8)

| | | | | | | | | | |
|---|---|---|---|---|---|---|---|---|---|
| WORD 0 | D0 | D1 | D2 | D3 | D4 | D5 | D6 | D7 | P0 |
| WORD 1 | D8 | D9 | D10 | D11 | D12 | D13 | D14 | D15 | P1 |
| WORD 2 | D16 | D17 | D18 | D19 | D20 | D21 | D22 | D23 | P2 |
| | : | : | : | : | : | : | : | : | : |
| WORD (n) | $D_{(8n)}$ | $D_{(8n+1)}$ | $D_{(8n+2)}$ | $D_{(8n+3)}$ | $D_{(8n+4)}$ | $D_{(8n+5)}$ | $D_{(8n+6)}$ | $D_{(8n+7)}$ | $P_{(n)}$ |
| | : | : | : | : | : | : | : | : | : |
| WORD 63 | D504 | D505 | D506 | D507 | D508 | D509 | D510 | D511 | P63 |
| WORD 64 | Q0 | Q1 | Q2 | Q3 | Q4 | Q5 | Q6 | Q7 | P64 |

DEVICE, DATA SECTOR, METHOD OF PROCESSING DATA, AND SIGNAL-BEARING MEDIUM EMBODYING PROGRAM OF DEVICE

BACKGROUND OF THE INVENTION

The present invention relates to data processing devices requiring high reliability such as disk arrays and server devices whose object is to hold data, and relates in particular to a data processing device and memory correction method for the data processing device for correcting the memory using an error check code and improving the data reliability.

Figure 14:
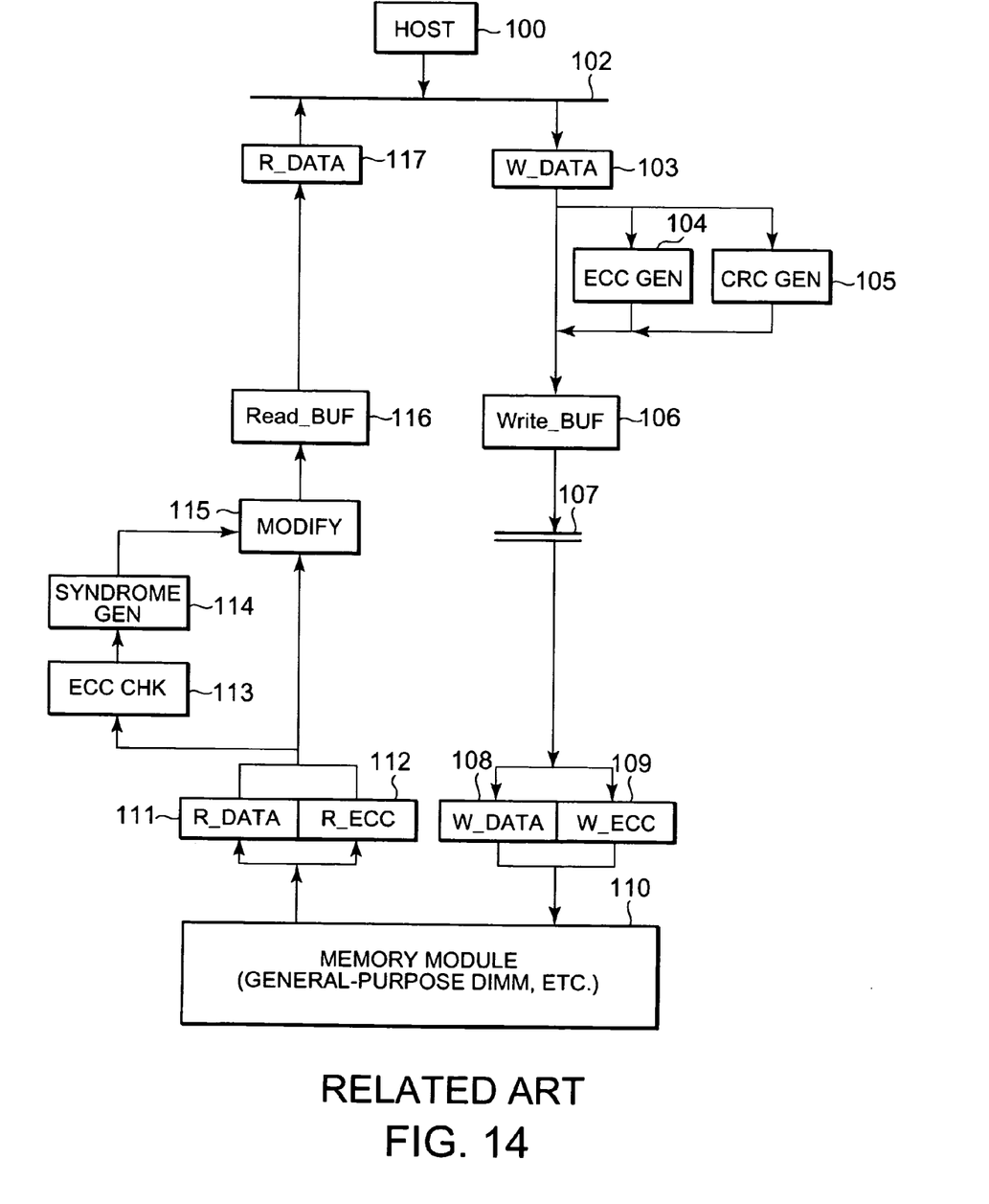
FIG. 14 is an exemplary block diagram of a data processor circuit of the related art.

FIG. 14 is a descriptive view of memory correction in the related art. FIG. 14 shows the data path used when writing data from host 100 onto memory module 110, and shows the data path when transferring read data from memory module 110 to host 100.

When the host 100 writes data into memory module 110 via host bus 102, error checking code (ECC) generator circuit 104 generates a 16-bit ECC code for 128-bit write data 103, and after passing through write buffer 106 and write-back selector 107, the data is finally written into memory module 110 in a state where ECC code 109 is attached to write data 108.

When host 100 makes a request, read data 111 and read ECC code 112 belonging to data 111 are read out from memory module 110. ECC check circuit 113 makes an error check. If an error is detected, then read data 111 and read ECC code 112 are input to syndrome generator circuit 114, and a syndrome is generated to show the error location (i.e., the location needing correction). Modifier circuit 115 performs data correction on read data 111, so that normal data is restored.

In high reliability server devices, write ECC code 109 stored in memory module 110 in FIG. 14, at this time utilizes an S4EC-D4ED code which is 16 bits of write data 108 versus the 128-bit write data 108, and corrects single blocks of 4 bits each using a 1-block correction—2-block error detection function. Besides this code, an SEC-DED code may be utilized for example, for 1-bit-correction—2-bit error detection using 8 bit ECC code in the case of 64 bit data with a small data width.

The "SEC-DED" mentioned above is an abbreviation for Single bit Error Correction-Double bit Error Detecting, and is a code for one-bit-correction—two bit error detection based on the Hamming code. Also, among SbEC-DbED (Single b-bit byte Error Correcting-Double b-bit byte Error Detecting) code based on the Reed-Solomon code, the "S4EC-D4ED" is a two type error correction code for signal byte error correction capable of correcting four bits (b=4) as one byte.

As shown in the above background art, a check code is utilized to check the memory data and an example of the art is JP Patent Publication (Kokai) No. 8-138391 A (1996).

SUMMARY OF THE INVENTION

However the SEC-DED code which adds 8-bit ECC code to 64-bit data only corrects one bit, and 4-bit error correction may not be possible. When using the S4ED-D4ED code capable of 4-bit correction on 64 bit data, for example, a 12-bit ECC code should be added. Therefore, there may be a compatibility problem with general-purpose modules (e.g., 72-bit) that are becoming widely used.

For example, server devices may use two 72-bit general-purpose memory modules in parallel, and in this case the 16-bit ECC code can be added to the applicable 128-bit data. Because the code being utilized is the S4ED-D4ED code, however, 8-bit correction or higher may be impossible though the correction is up to 4 bits.

For example, S8EC coding may be well known for using 8-bit error correction on 128-bit data with magnetic tape, etc. However, even in this exemplary case the ECC code requires a minimum of 24 bits, so that general-purpose memories below 144 bits may not be used.

Even if preparations are made for reliability to withstand 4-bit failures by using S4EC-D4ED coding, and two general-purpose memory modules are arrayed in parallel, the single memory chip on the inexpensively produced memory modules use 8 bits or 16 bits. A failure exceeding the error correction performance therefore may occur during a chip failure, and the device reliability deteriorates.

Simultaneous with the above, the memory modules may be restricted to using only memory chips with a 4-bit width. Also, devices using high-priced memory modules holding many memory chips, and especially devices using many memory modules, have the problem that the device cost is high.

One method that eliminates these exemplary problems, utilizes the block correction method for broadly collecting the data into specified block units without attaching a code to the one-word ECC, and then expanding the error correction capacity by using large bit ECC code on those block units.

However this ECC code serving as the check code is in block units. Error checks cannot therefore be made when the user wants to read the data in small word units, and all block units should be read. As a result, in this method, memory access efficiency deteriorates.

Therefore, a novel technology should be developed, capable of 8-bit error or higher correction when using low-cost, general-purpose 72-bit memory modules, and 16-bit or higher error correction for two 144-bit memory modules arrayed in parallel.

In view of the foregoing and other exemplary problems, drawbacks, and disadvantages of the conventional techniques, it is an exemplary feature of the present invention to provide a device, a data sector, a method of processing data, and a signal-bearing medium embodying program of the device with a low cost, and high reliability that does not deteriorate even if using general-purpose memory chips with a bit width (e.g., 16, 32 or 72-bit width) having a low cost yet high reliability.

The present invention provides a device for processing data read from a memory, the data including a word and a parity element with respect to the word, the device including a data recovery circuit that corrects error data in the word using a correction code generated from the parity element.

The present invention also provides a device for processing a host data written to a memory, including a CRC generator that generates a CRC element from the host data and a parity generator that generates a parity element from the data.

The present invention also provides a data sector, including a word, a parity element with respect to the word, and a CRC element.

The present invention also provides a method of processing data read from a memory, the data including a word, and a parity element with respect to the word, the method including correcting error data in the word using a correction code generated from the parity element.

The present invention also provides a signal-bearing medium embodying a program of machine-readable instructions executable by a device, the program causing the device to perform a method above.

The present invention also provides a method of processing a host data written to a memory, including generating a CRC element from the host data, generating a parity element from the data, and writing the host data, the CRC element and the parity element to the memory.

The present invention also provides a signal-bearing medium embodying a program of machine-readable instructions executable by a device, the program causing the device to perform a method above. [Exemplary Advantage of the Invention]

For example, this invention may provides a low cost and highly reliable memory correction method and data processing device whose reliability does not deteriorate even if using a general-purpose width memory chip.

BRIEF DESCRIPTION OF THE DRAWINGS

The novel and exemplary features believed characteristic of the invention are set forth in the appended claims. The invention itself, however, as well as other exemplary features and advantages thereof, will be best understood by reference to the detailed description which follows, read in conjunction with the accompanying drawings, wherein:

DETAILED DESCRIPTION OF THE EXEMPLARY EMBODIMENTS

The exemplary embodiments of the present invention will be described referring to the drawings.

Figure 1:
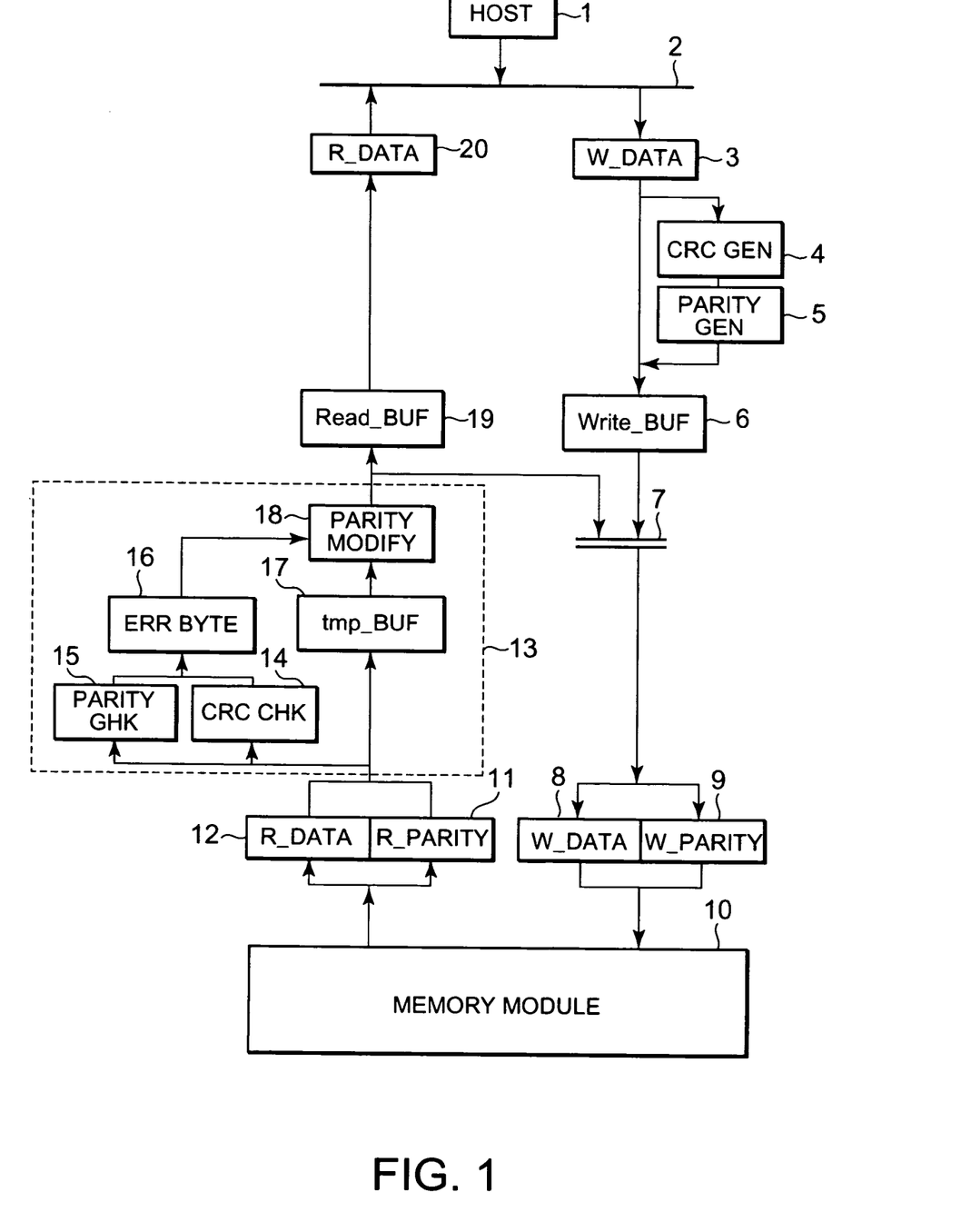
FIG. 1 is an exemplary block diagram of a portion of a data processing device of the exemplary embodiment of this invention.

FIG. 1 is an exemplary structural drawing of a portion of the data processing device of this invention. FIG. 1 shows the data paths during writing of data from host 1 to memory module 10 (e.g., a semiconductor memory), and shows the data path when transferring read data from memory module 10 to host 1.

To transfer data from host 1 to memory module 10, host 1 sends write data 3 via host bus 2. Write data 3 is transferred from write buffer 6 to write-back selector 7, and then to memory module 10. However in the present mode, write data 3 also may be input to check code generation circuits (e.g., CRC generator circuit 4 and parity generator circuit 5) and the subsequent process is performed.

As described below, for example, CRC generator circuit 4 may count the number of data bytes each time write data 3 is stored in write buffer 6, and stores the obtained CRC result (CRC code) in write buffer 6 each time a certain number of bytes of data (e.g., 512 bytes) are transferred. For example, parity generator 5 may separate write data 3 into byte units, and generates parity data by EXOR (exclusive OR) processing, as described below.

When transferring memory module 10 data to host 1 due to a request from host 1, read data 12 read from memory module 10, and read parity data 11 may be input to data recovery circuit 13.

Data recovery circuit 13 may contain a plurality of check circuits. For example, one check circuit may be parity check circuit 15 for making parity checks of read data 12 and read parity data 11. Another check circuit may be a CRC check circuit 14 for checking the cyclic redundancy code (CRC). Data recovery circuit 13 corrects error data in a word using correction code generated from read parity data 11.

For example, data recovery circuit 13 may specify the error byte from the check results of a plurality of check circuits (e.g., two check circuits 14 and 15), write what byte position of the data will be error-corrected in error byte table 16, and temporarily store read data 12 and read parity data 11 in temporary buffer 17 while the error is detected. Modifier circuit (e.g., parity modifier circuit) 18 may rewrite the byte positions specified by error byte table 16. Read data 12 and read parity data 11 whose error position is rewritten by modifier circuit 18, are then stored in read buffer 19, and sent as read data 20 to host 1.

Figure 2:
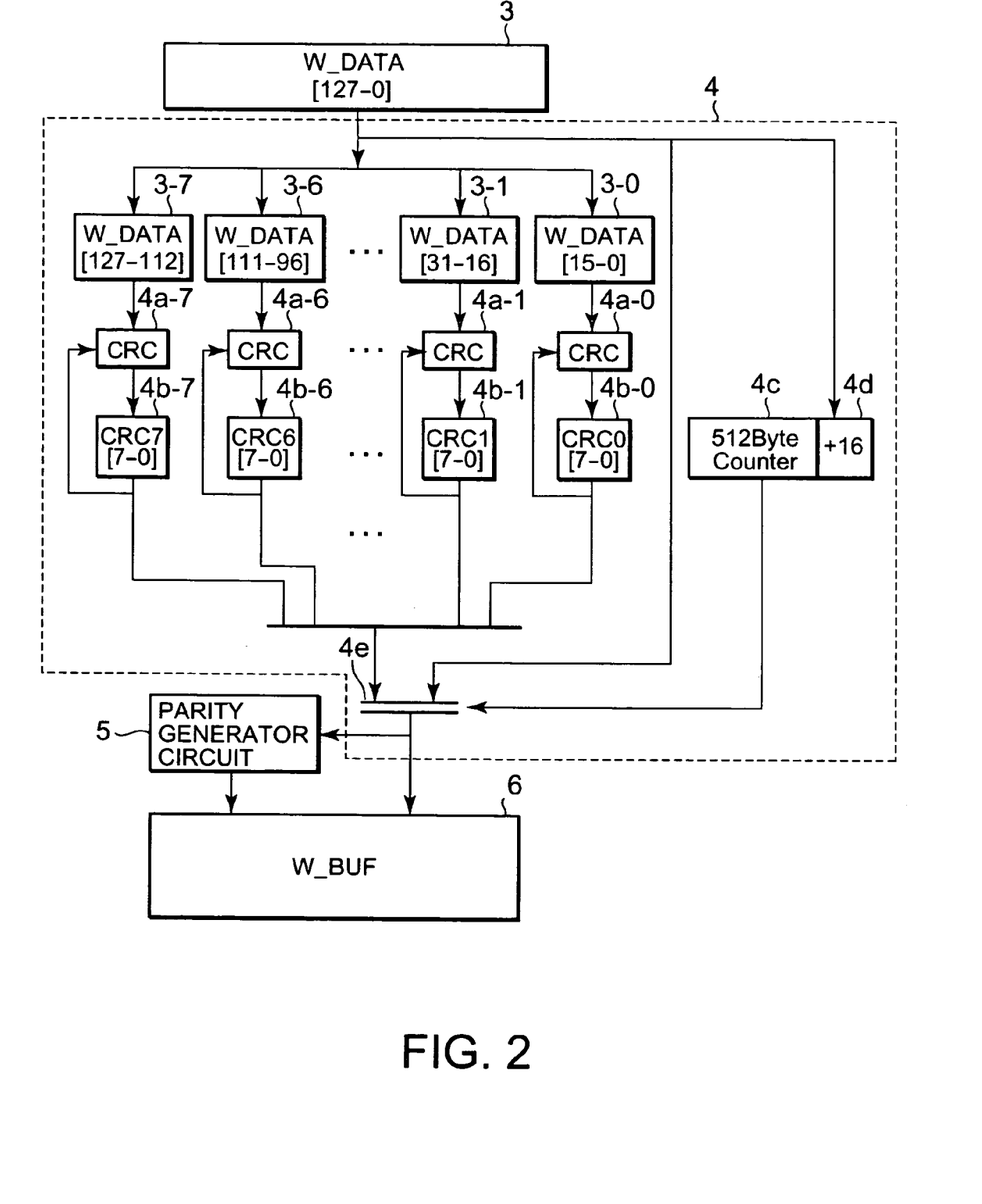
FIG. 2 is an exemplary detailed block diagram of a cyclic redundancy code (CRC) generator circuit 4 shown in FIG. 1.

FIG. 2 shows exemplary CRC generator circuit 4 of FIG. 1 in detail. CRC generator circuit 4 divides write data 3 into a certain bit (e.g., two byte) units of byte data 3-0 through 3-7, and the respectively separate CRC processing circuits 4a-0 through 4a-7 generate the CRC codes 4b-0 through 4b-7.

Counters 4c, 4d count the transfer of a certain bit (e.g., 512 bytes) of write data 3. Selector 4e transfers the CRC processing results to the write buffer 6 each time the counter indicates 512 bytes.

Figure 3:
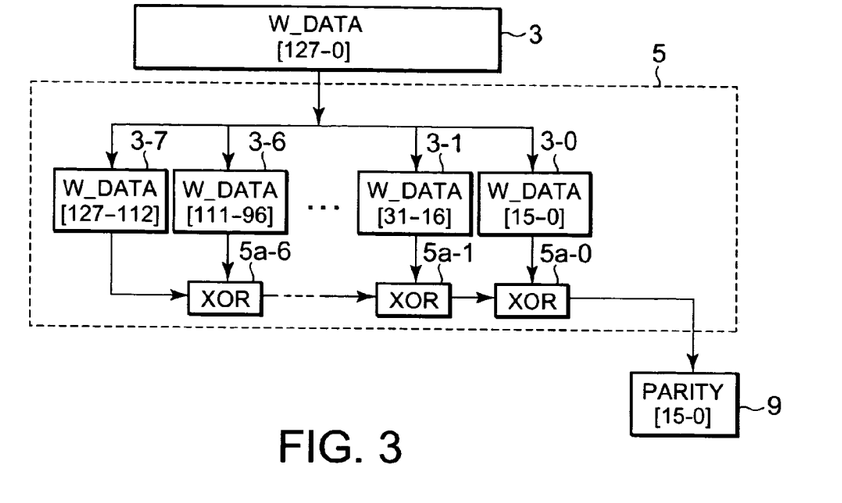
FIG. 3 is an exemplary detailed block diagram of a parity generator circuit 5 shown in FIG. 1.

FIG. 3 is an exemplary detailed view of parity generator circuit 5 in FIG. 1. Parity generator circuit 5 separates a certain bit (e.g., 128-bit) write data 3 into a certain bit data (e.g., byte data 3-0 through 3-7) of 16 bits each. The byte data 3-0 through 3-7 are EXOR processed by EXOR circuits 5a-0 through 5a-6 at this time and parity data 9 is generated.

Figure 4:
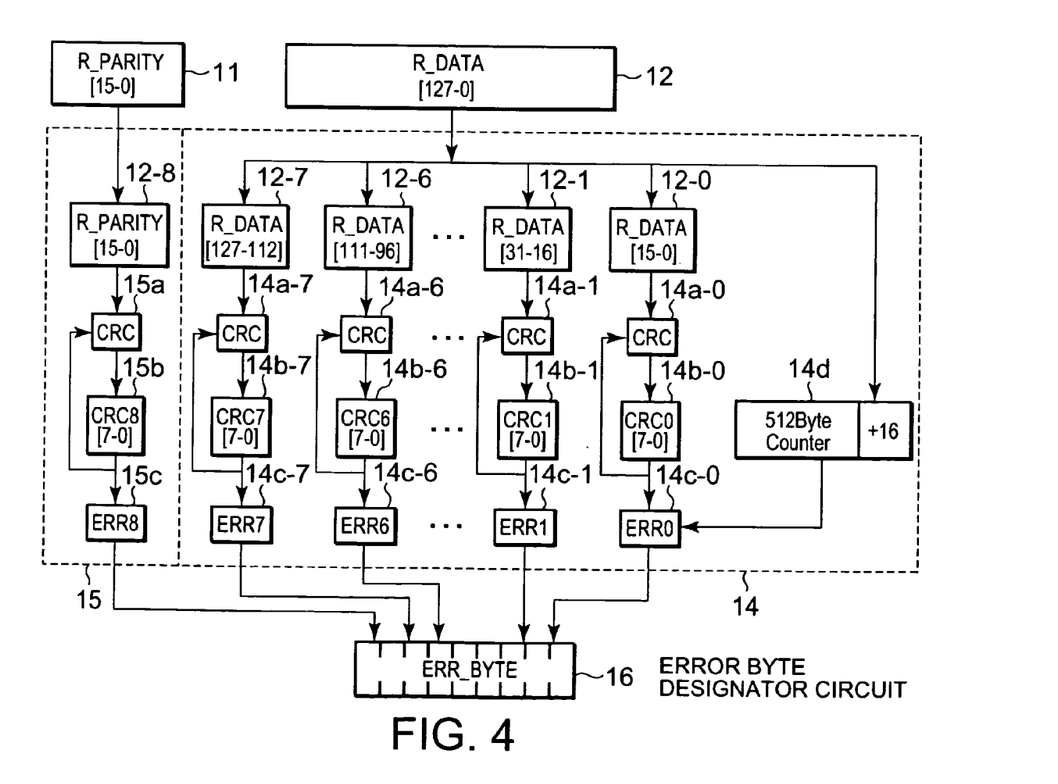
FIG. 4 is an exemplary detailed block diagram of an error byte designator circuit shown in FIG. 1.

FIG. 4 is an exemplary detailed view of the error byte designator circuit made up of CRC check circuit 14, parity check circuit 15 and error byte table 16 within the data recovery circuit 13 of FIG. 1. Read data 12 is separated into a certain predetermined bit (e.g., two byte) units of byte data 12-0 through 12-7, including the read parity data 11 (12-8), and respective separate CRC processing circuits 14a through 14-7 make a check of CRC data 14a-0 through 14a-7, 15b. Those check results are then stored in error byte table 16 as error flags 14c-0 through 14c-7, 15c in accordance with the timing of counter 14d (e.g., 512-byte counter).

Figure 5:
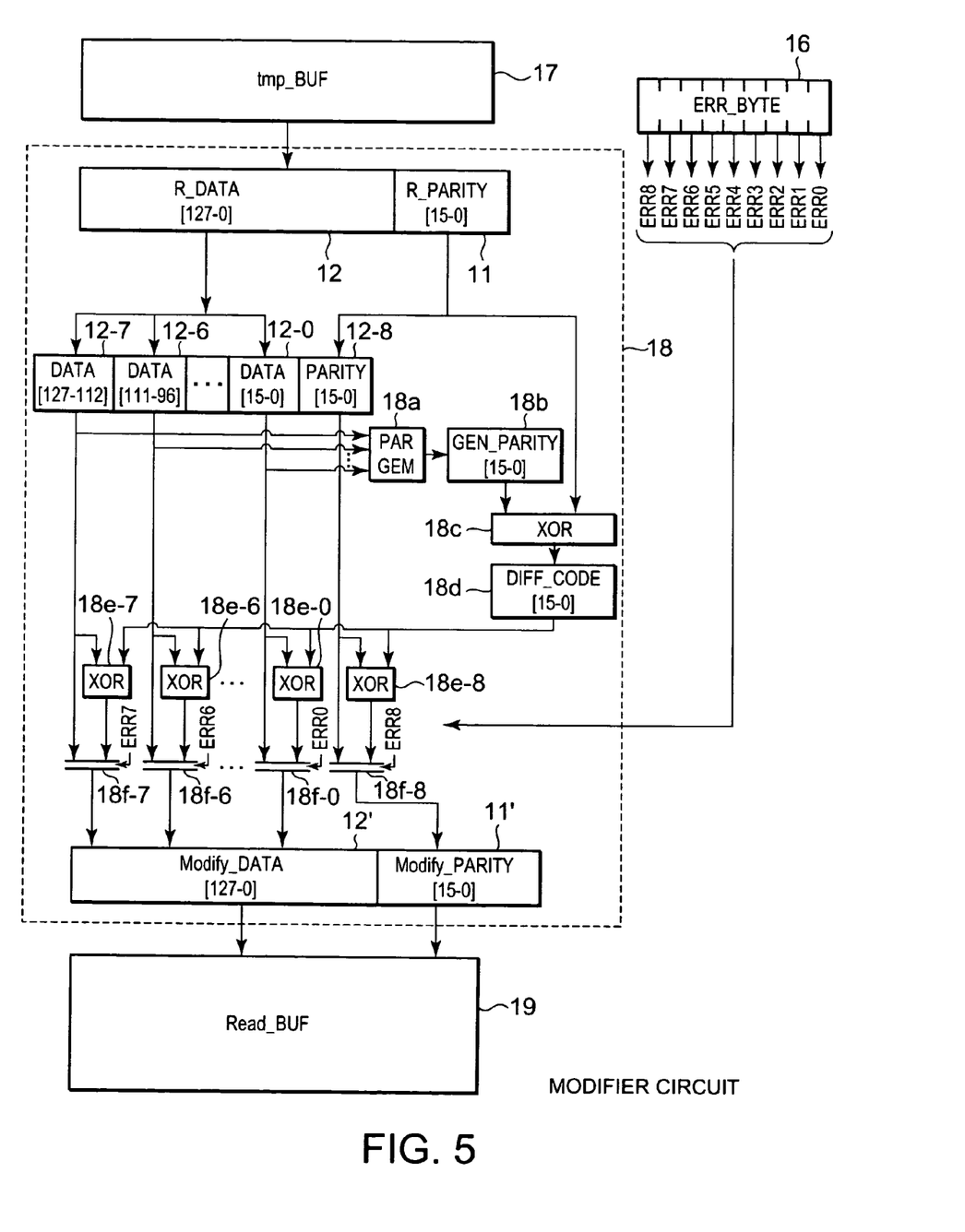
FIG. 5 is an exemplary detailed block diagram of a parity modifier circuit 18 shown in FIG. 1.

FIG. 5 is an exemplary detailed view of the modifier circuit 18 in FIG. 1. Read data 12 and read parity 11 read out from the temporary buffer 17 are each separated into a certain bit (e.g., two byte) data units 12-0 through 12-8. Parity generator circuit 18a possessing the same structure as in FIG. 2, generates parity data 18b.

This generated parity data 18b, and parity data 11 read out from temporary buffer 17 are input to EXOR processing circuit 18c. EXOR processing circuit 18c outputs DIFF code 18d.

Each of the two byte units of data 12-0 through 12-8 and DIFF code 18d is input to EXOR (processing) circuits 18e-0 through 18e-8. The outputs from EXOR (processing circuits) 18e-0 through 18e-8 and the two byte units of data 12-0 through 12-8 are input to each of selectors 18f-0 through 18f-8. Byte position signals ERR1 through ERR8 written in error byte table 16, are added as select signals to each of selectors 18f-0 through 18f-8.

Namely, one of selectors 18f-0 through 18f-8 outputs the output from EXOR (processing circuits) 18e-0 through 18e-8, when error byte table 16 sends a select signal to a corresponding one of selectors 18f-0 through 18f-8, and other selectors 18f-0 through 18f-8 output the two byte units of data 12-0 through 12-8. Modified (corrected) read data 12' and parity 11' may be generated in this exemplary way, written in read buffer 19, and become read data 20 of FIG. 1.

Figure 6:
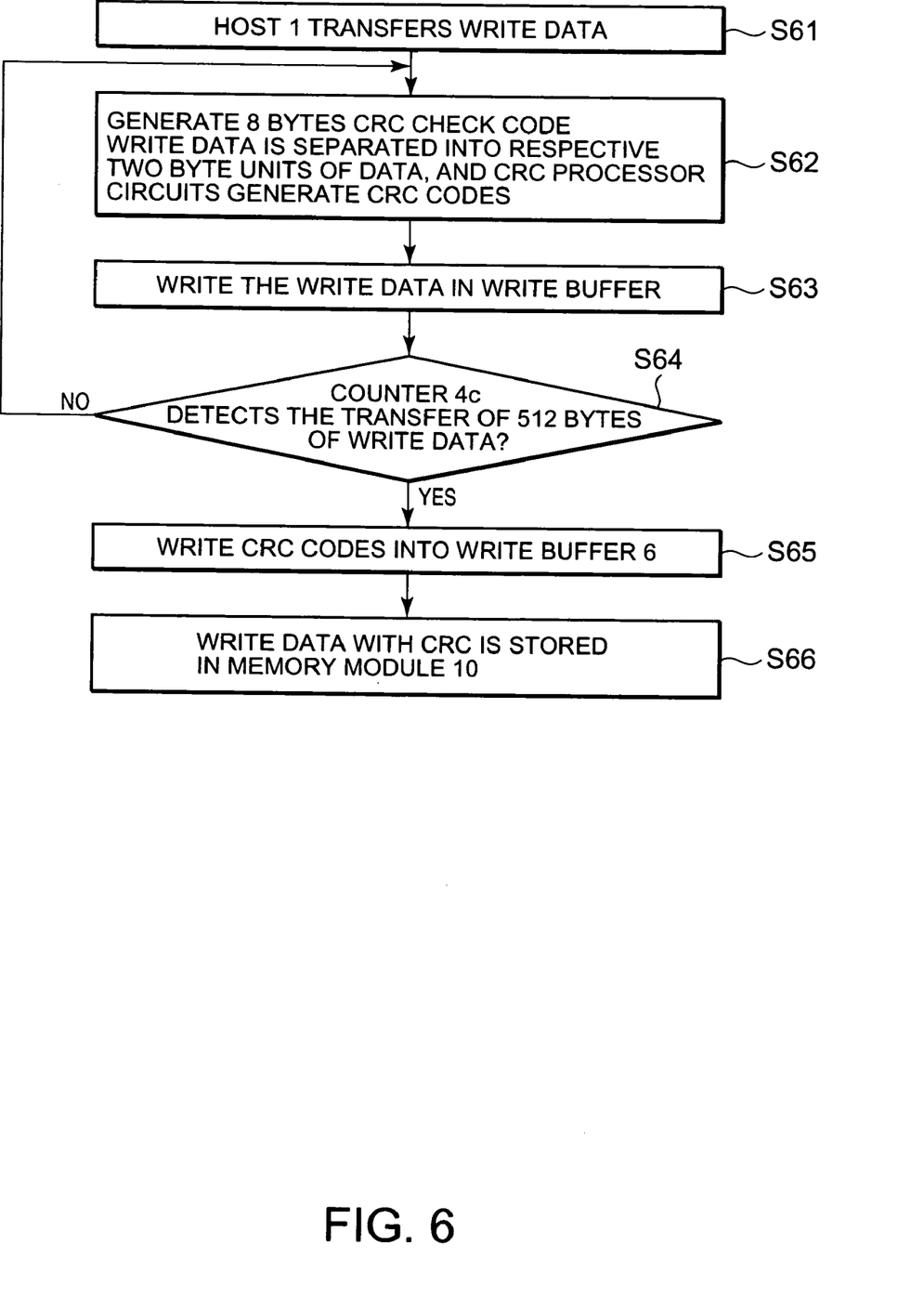
FIG. 6 is an exemplary flowchart of writing data 3 with CRC to memory module 10.

Next, the exemplary operation of this data processing device will be described. FIG. 6 is an exemplary flowchart of writing data 3 with CRC to memory module 10. Host 1 sends data (e.g., transfers write data) to memory module 10 (S61). When storing data in memory module 10, CRC generator circuit 4 generates an eight-byte CRC check code each time 512 bytes of write data 35 are sent from host 1, and adds a CRC code behind write data 3. This exemplary operation is described with reference to FIG. 2.

In FIG. 2, write data 3 is separated into respective certain predetermined bit (e.g., two byte) units of data 3-0 through 3-7, and CRC processor circuits 4a-0 through 4a-7 generate CRC codes 4b-0 through 4b-7 (S62). The CRC code at this time then generates a certain bit (e.g., two bytes) of data into one byte of CRC code, by executing the following formula a plurality (e.g., two) times.

Here, Ci+1 (x) signifies the new CRC code to generate, Di (x) is the data to input, and Ci (x) is the original CRC data during data input.

$$Ci+1(7)=Ci(0)+Di(0)$$

$$Ci+1(6)=Ci(7)+Di(7)$$

$$Ci+1(5)=Ci(6)+Di(6)+Ci(0)+Di(0)$$

$$Ci+1(4)=Ci(5)+Di(5)+Ci(0)+Di(0)$$

$$Ci+1(3)=Ci(4)+Di(4)+Ci(0)+Di(0)$$

$$Ci+1(2)=Ci(3)+Di(3)$$

$$Ci+1(1)=Ci(2)+Di(2)$$

$$Ci+1(0)=Ci(1)+Di(1)$$

This calculation is performed on each of the certain bit (e.g., two-byte) data 3-0 through 3-7.

When counter 4c detects the transfer of a certain bit (e.g., 512 bytes) of write data 3 while being stored in write buffer 6 (S63, S64), and writing of that data ends, counter 4c writes CRC codes 4b-0 through 4b-7 into write buffer 6 (S65). Data checks can now be made by CRC codes 4b-0 through 4b-7 during subsequent data transfers. Write data 3 with CRC is stored in memory module 10 (S67).

Figure 7:
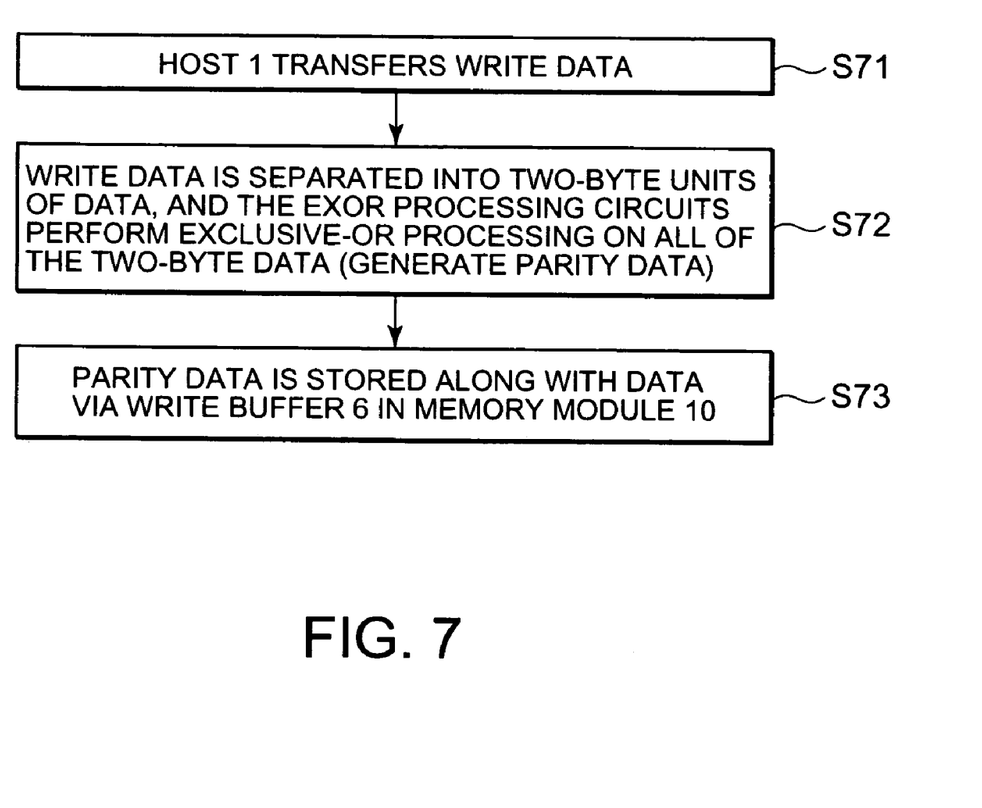
FIG. 7 is an exemplary flowchart of writing parity data to memory module 10.

FIG. 7 is an exemplary flowchart of writing parity data to memory module 10. When storing write data 3 and CRC codes 4b-0 through 4b-7 in the write buffer 6, parity generator circuit 5 setting 16 bytes as 1 word, attaches two bytes of parity data to each word. This first exemplary operation will be described referring to FIG. 3.

Host 1 transfers write data (S71). In FIG. 3, write data 3 is separated into a certain bit (e.g., two-byte) units of data 3-0 through 3-7, and the EXOR processing circuits 5a-0 through 5a-6 perform exclusive-OR processing on all of the two-byte data 3-0 through 3-7 (S72). In other words, bit "0" of parity data 9 is the EXOR logic for the eight bits 0, 16, 32, 48, 64, 72, 96, 112 of data 3-0 through 3-7.

Bit "1" of parity data 9 is the EXOR logic for the eight bits 1, 17, 33, 49, 65, 73, 97, 113 of data 3-0 through 3-7. Bit "2" of parity data 9 is the EXOR logic for the eight bits 2, 18, 34, 50, 66, 74, 98, 114 of data 3-0 through 3-7. Hereafter, all bits are generated by EXOR logic in the same way.

A zero ("0") results when the generated parity data 9 is again EXOR processed along with data 3, and therefore allows checking that data 3 is correct. This parity data 9 is stored along with data 3 via write buffer 6 in memory module 10 to complete the write operation (S73).

Next, the exemplary operation for transferring read data 12 read from memory module 10 for host 1 will be described with reference to FIG. 1. Data recovery circuit 13 detects an error position of data using the parity data 11 and a CRC data read from memory module 10.

Read data 12 and corresponding read parity data 11 are transferred to modifier circuit 13 after being loaded from memory module 10. While being checked by parity check circuit 15, read data 12 and parity data 11 are stored in temporary buffer 17 until CRC data for the final sector is input.

If parity check circuit 15 finds no error, then the data stored in temporary buffer 17 is unchanged and transferred via read buffer 19 to host 1.

If parity check circuit 15 finds an error, then the error byte position is specified by CRC check circuit 14. FIG. 4 shows the error byte designator circuit for generating error byte table 16 by read data 12 and parity data 11.

Read data 12 and parity data 11 are respectively separated into a certain bit (e.g., two-byte) data 12-0 through 12-7, and 12-8, and are each checked by CRC processor circuits 14a-0 through 14a-7, and 15a. If CRC errors 16-0 through 16-8 occur at this time, then the error location is written in error byte table 16. The error byte table 16 is at this time present as nine bits of data in a structure using only 1-bit, and correction is impossible if a two-bit error occurs. The processing shifts to modifier circuit 18 of FIG. 5 at the point where the error byte table 16 is confirmed.

Modifier circuit 18 of FIG. 5 loads (reads out) read data 12 and parity data 11 from temporary buffer 17 at the point that error table 16 is confirmed.

Read data 12 is handled in a certain bit (e.g., two byte) units at this time. Parity generator circuit 18a generates parity data 18b. DIFF code 18d is then generated by EXOR logic using the transferred read parity data 11.

DIFF code 18d is a correction code for changing the parity-generation-related read data 12 and read parity data 11 to a correct code. EXOR logic is performed on DIFF code 18d and data 12-0 through 12-8 to correct the data in the error location specified in error byte table 16. Data 12' and parity (data) 11' of which error data is corrected in the correct positions are generated and stored in read buffer 19.

Data stored in read buffer 19 is finally transferred to host 1 as its data transfer destination, and the read operation terminates.

Figure 8:
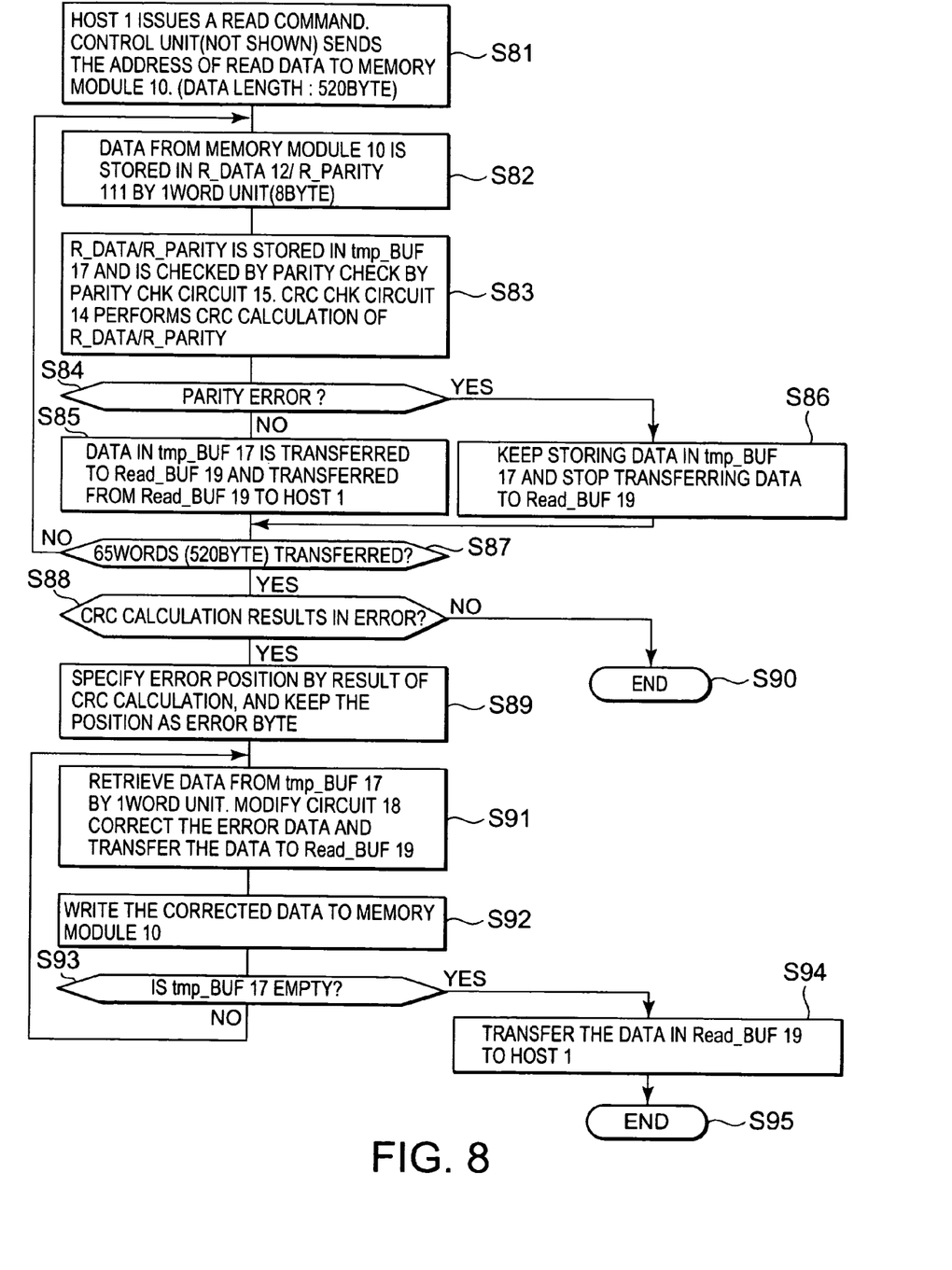
FIG. 8 is an exemplary flowchart of reading data from memory module 10.

Next, the exemplary operation for transferring read data 12 read from memory module 10 for host 1 will be discussed with an exemplary flowchart. FIG. 8 is an exemplary flowchart of reading data from memory module 10.

First, host 1 issues a read command. A control unit (not shown) sends the address of read data to Memory Module 10 (data length: 520 Byte)(S81).

Data from Memory Module 10 is stored in R_DATA 12/R_PARITY 11 in 1-word units (8-Byte) (S82). R_DATA/R_PARITY is stored in tmp_BUF 17, and is checked by parity check by PARITY CHK Circuit 15. CRC CHK Circuit 14 performs CRC calculation of R_DATA/R_PARITY (S83).

If a parity error does not occur, then data in tmp_BUF 17 is transferred to Read_BUF 19, and is transferred from Read_BUF 19 to Host1 (S84 and S85). If a parity error occurs, then data is kept being stored in tmp_BUF 17 and data is stopped being transferred to Read_BUF 19 (S84 and S86).

If 65 words (520 Byte) have been transferred, then a CRC calculation is checked (S87 and S88). If a CRC calculation results in error, then an error position is specified by the result of the CRC calculation, and the position is kept as an error byte (S88 and S89). If the CRC calculation does not result in error, then the data processing ends.

Next, data is retrieved from tmp_BUF 17 in 1-word units. Modify circuit 18 corrects the error data, and transfers the data to Read_BUF 19 (S91). The corrected data is written to Memory Module 10 (S92). If tmp_BUF 17 is empty, then the data in Read_BUF 19 is transferred to Host 1, and then the process ends(S93, S94 and S95). If tmp_BUF 17 is not empty, then the process returns to S91.

Figure 9:
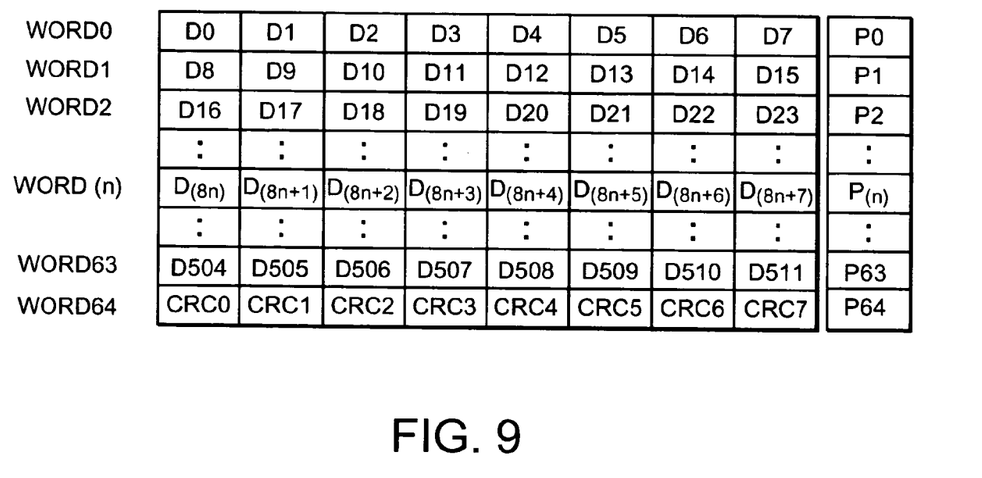
FIG. 9 is an exemplary data format.

Next, FIG. 9 shows an exemplary data format of the exemplary embodiment. This exemplary format shows the format for storing data in an 8-Byte width memory, when 1 sector includes data (e.g., 512 Bytes) and CRC (e.g., 8 Bytes). For example, 1 sector includes 65 words. Each word corresponds to parity elements. Each of the words except for a last word, includes eight data elements. The last word includes eight CRC elements. When a parity element is 1-Byte, every data element needs a 1-Byte CRC. Therefore, this exemplary sector includes 8 Bytes of CRC.

Figure 10:
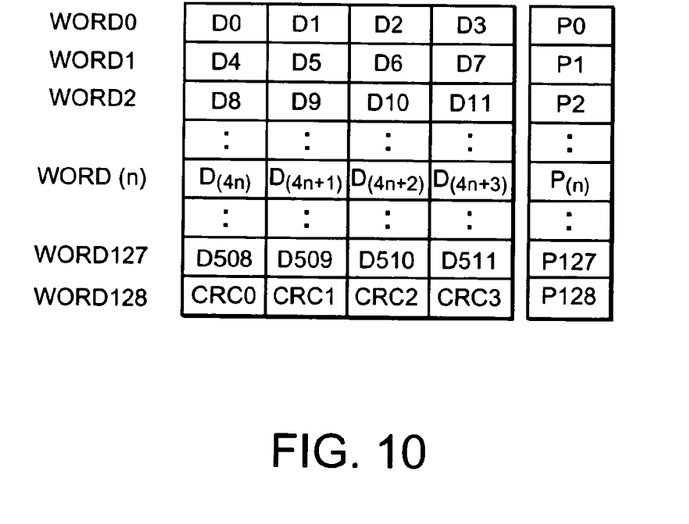
FIG. 10 is another exemplary data format.

FIG. 10 shows another exemplary data format of the exemplary embodiment. This format shows the format for storing in a 4-Byte width memory, when 1 sector includes data (e.g., 512 Bytes) and CRC (e.g., 4 Bytes). For example, 1 sector includes 128 words. Each words corresponds to a parity element. Each of the words except for the last words, includes four data elements. The last word includes four CRC elements. When a parity element is 1-Byte, this exemplary sector includes 4 Bytes of CRC (may not necessarily need 8 Bytes of CRC).

Figure 11:
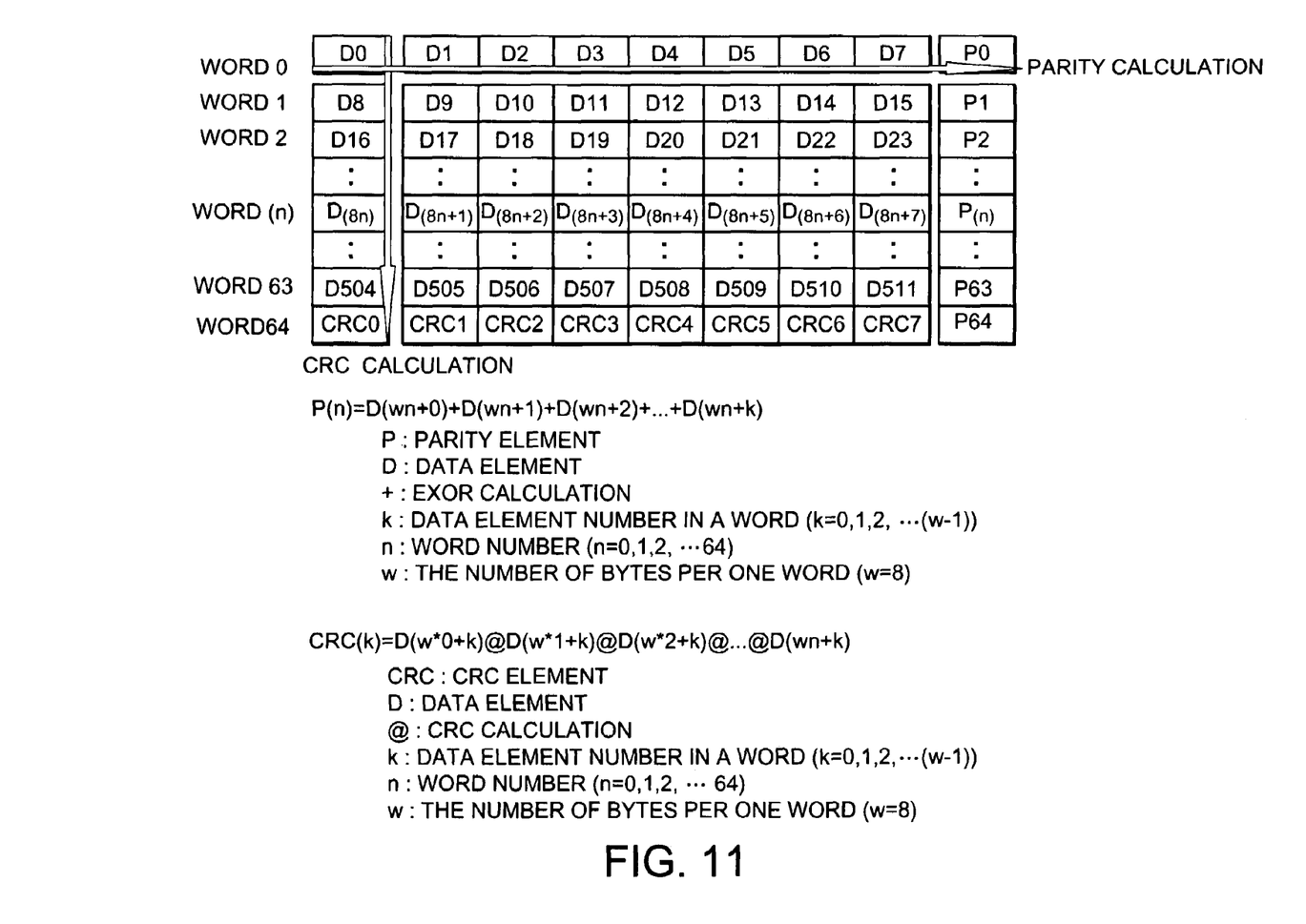
FIG. 11 is an exemplary data format showing an exemplary parity calculation and CRC calculation.

Next, FIG. 11 shows an exemplary operation when a datum is out of order in the memory module 10. As shown in FIG. 9, this format shows the format for storing in the 8-Byte width memory, when 1 sector includes data (e.g., 512 Bytes) and CRC (e.g., 8 Bytes). For example, 1 sector includes 65 words. Each word corresponds to parity elements. Each of the words except for a last word, includes eight data elements. The last word includes eight CRC elements. The following is an exemplary definition of Parity elements P0-P64.

$$P(n)=D(wn+0)+D(wn+1)+D(wn+2)+ \ldots +D(wn+k)$$

P: Parity element
D: Data element
+: EXOR calculation
k: data element number in a word (k=0, 1, 2, . . . (w−1))
n: word number (n=0, 1, 2, . . . 64)
w: the number of bytes per one word (w=8)

The following is an exemplary definition of CRC element 0-7.

$$CRC(k)=D(w*0+k)@D(w*1+k)@D(w*2+k)@ \ldots @D(wn+k)$$

CRC: CRC element
D: Data element
@: CRC calculation
k: data element number in a word (k=0, 1, 2, . . . (w−1))
n: word number (n=0, 1, 2, 64)
w: the number of bytes per one word (w=8)

For example, when D0 is out of order in memory module 10, a discrepancy of Parity Data P0 is detected by a parity calculation, and an error of CRC 0 is detected by a CRC calculation. Conversely, when both of a CRC check result of CRC 0 and a parity calculation result of P0 are detected, an error of D0 may be detected.

When the error byte (e.g., D0) is detected, the error data is corrected by following equation.

$$D0=P+D1+D2+D3+D4+D5+D6+D7$$

For this equation, however, every element which is calculated should include a same bit width. The bit width of CRC is the same as the bit width of the data element and the bit width of the parity element. For this reason, the number of CRCs is the number of bits of one word divided by the number of bits of parity element.

Figure 12:
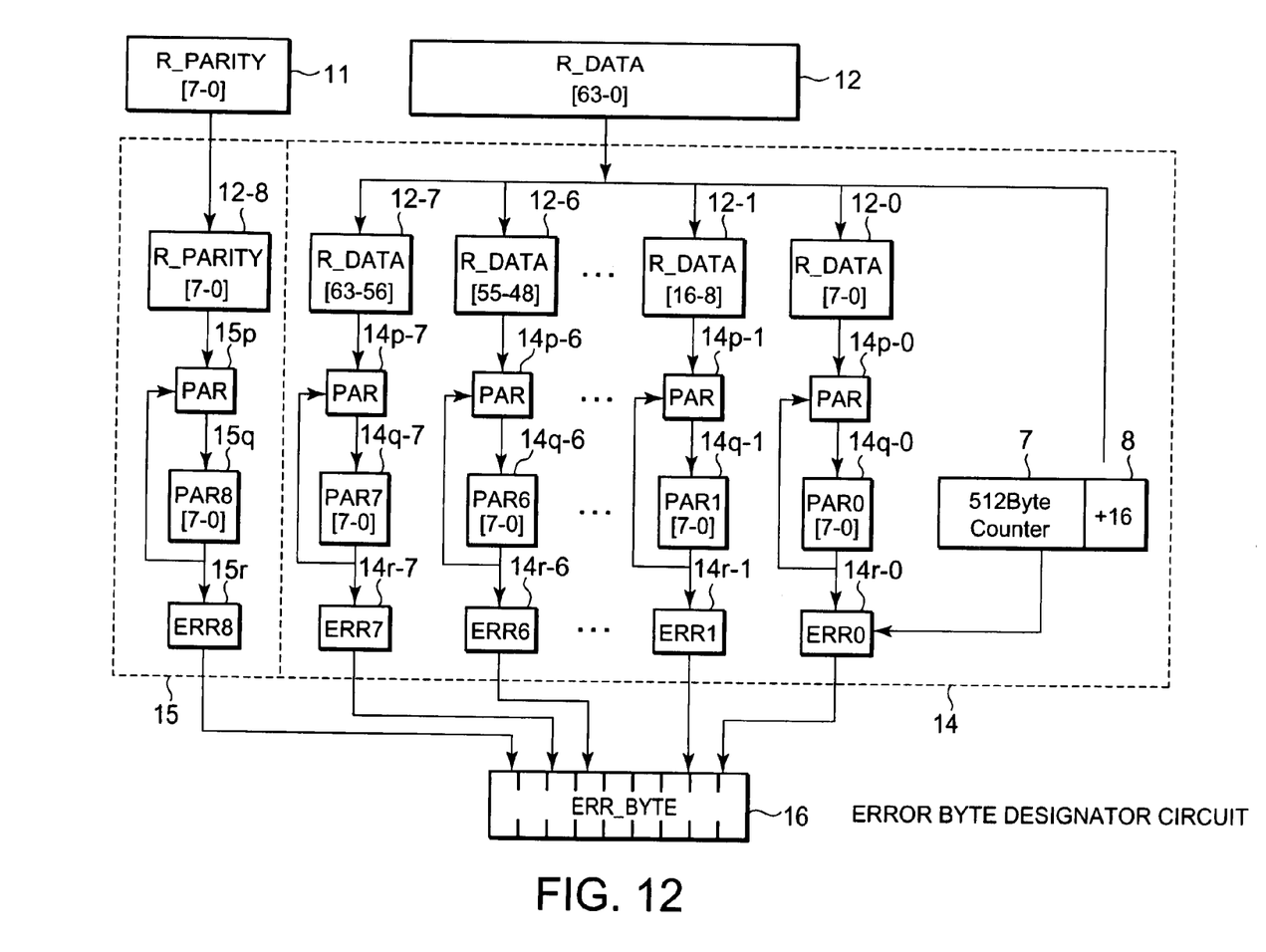
FIG. 12 is an exemplary block diagram of the error byte designator circuit for another exemplary embodiment.

FIG. 12 illustrates another exemplary embodiment of the error byte designator circuit for making the error byte table 16. This exemplary embodiment contains parity check circuits 14p-0 through 14p-7, and 15p, instead of CRC processor circuits 14a-0 through 14a-7, and 15a of FIG. 4. When using parity for checking sector (e.g., 512 byte) data in this exemplary embodiment, parity check circuits 14p-0 through 14p-7, and 15p generate parity 14q-0 through 14q-7, and 15q, specify the error locations, and store error flags 14r-0 through 14r-7, and 15r that indicate the error locations, into the error byte table 16.

Namely, data recovery circuit 13 detects an error position of data using the first parity element (e.g. 14p-0 through 14p-7, and 15p) and a second parity element (e.g. parity 14q-0 through 14q-7, and 15q) of sector data read from memory module 10.

Figure 13:
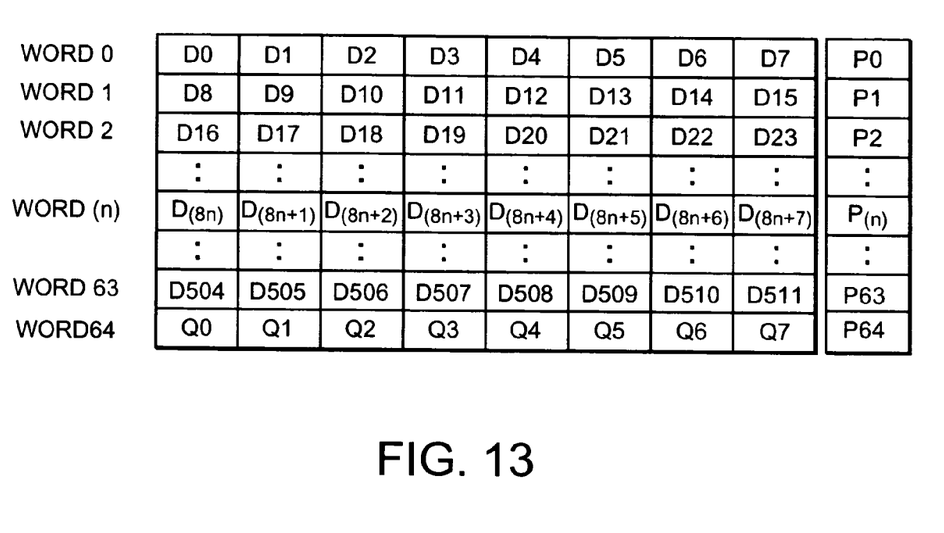
FIG. 13 is an exemplary data format for another exemplary embodiment.

FIG. 13 is an exemplary data format for the error byte designation circuit in FIG. 12. Compared with FIG. 9, CRCs 0-7 are substituted to Q0-Q7 (second parity).

The exemplary embodiments of the invention, for example may attach eight bit parity data to 64-bit data, may attach 16-bit parity data to 128-bit data, may define that data with one word, and stores them together in the memory module. When writing that data and generated parity data in the memory, this exemplary embodiment handles the data in single write units (sectors) of 512 bytes each and adds a CRC code at the end of the data.

The CRC codes prepares a number of bytes equal to a one word data width divided by the parity data width, and when the data is eight bytes and the parity data one byte, the CRC code prepares an 8 byte CRC, and when the data is 16 bytes and the parity data is 2 bytes, generates an 8 byte CRC.

The data and parity data is EXOR processed in one-word units when read from the memory module, and processing results of zero ("0") confirm that that data is normal. When incorrect data is detected, one sector of data including that word is read-out, CRC check results obtained, and the abnormal byte position is in this way detected.

The abnormal byte position may be detected and the abnormal byte restored (corrected) from that byte position data and parity data using, for example, redundant array of inexpensive disks (RAID) technology.

In this exemplary embodiment, the parity data may be transferred along with data in one word, so that the parity check circuit can confirm that the one word of data is correct, and the read data can be checked without reading large data units of one sector, so that memory efficiency is enhanced during read.

In this exemplary embodiment, the bits prepared as the check code may be equal in number to the data correction capacity, so that a memory control circuit can be made capable of 16-bit correction of 144-bit memory modules, and 8-bit correction of 72-bit memory modules, for example.

In this way, besides allowing the correction capacity to be changed according to the system scale, a highly reliable device possessing 16-bit correction capacity may be fabricated in a system using two inexpensive, general-purpose 72-bit memory modules in parallel.

The present exemplary embodiment may provide, for example, a certain bit correction capacity (e.g., 8 bit or 16 bit correction capacity), so that even if with a more highly integrated memory with a certain bit width (e.g., 8 bits, 16 bits) on one memory chip, a general-purpose and inexpensive memory module may be used without decreased reliability, and devices using memory modules in large quantities may be built at a low cost, for example.

The data processing device of this invention is highly reliable yet low in cost, and therefore ideal for use in server devices and display devices, etc.

While this invention has been described with reference to exemplary embodiments, this description is not intended as limiting. Various modifications of the illustrative embodiments, as well as other embodiments of the invention, will be apparent to persons skilled in the art upon taking description as a whole. It is, therefore, contemplated that the appended claims will cover any such modifications or embodiments as fall within the true scope of the invention.

Further, the inventor's intent is to encompass all equivalents of all the elements of the claimed invention even if the claims are amended during prosecution.

This application is based on Japanese Patent Application No. 2005-143403 filed on May 17, 2005 and including specification, claims, drawings and summary. The disclosure of the above Japanese Patent Application is incorporated herein by reference in its entirety.

What is claimed is:

1. A device for processing data read from a memory, said data including:
   a word;
   a parity element with respect to the word, said device comprising:
   a data recovery circuit that corrects error data in said word using a correction code generated from said parity element,
   wherein said data recovery circuit comprises:
   a modifier circuit that includes:
      a parity generator circuit that generates a generated parity element from said data read from said memory;
      a first EXOR processing circuit that generates a DIFF code by EXOR logic using said parity element read from said memory and said generated parity element; and
      a second EXOR processing circuit that performs the EXOR logic on said error data in said word and said DIFF code.

2. The device according to claim 1, wherein said data recovery circuit detects an error position of said data using said parity element and a cyclic redundancy code (CRC) element of said data read from said memory.

3. The device according to claim 2, wherein said data recovery circuit further comprises:
   a parity check circuit that makes a parity check of said word and said parity element; and
   a CRC check circuit that specifies an error position in said word by making a check of said CRC element of said data read from said memory, if said parity check circuit finds an error.

4. The device according to claim 2, wherein said word comprises:
   a data element that includes a bit, a number of bits of said data element being equal to a number of a bit of said parity element,
   wherein a data element number is allocated to each data element in said word and to said CRC element, said CRC element with an element number corresponding to said data element with a same data element number, wherein:
   said parity check circuit makes parity checks of said word and said parity element; and
   said CRC check circuit specifies an error position by making CRC checks of said data element and said CRC element, if said parity check circuit finds an error.

5. The device according to claim 4, wherein said data recovery circuit further comprises:
   an error table to which said error position is writable;
   a third EXOR processing circuit that performs the EXOR logic on said DIFF code and one of said data element and said parity element; and
   a selector that inputs:
      said one of said data element and said parity element; and
      an output of said third EXOR processing circuit, and outputs:
      said one of said data element and said parity element, when said error table does not send a select signal to said selector; and
      said output of said third EXOR processing circuit, when said error table sends a select signal to said selector.

6. The device according to claim 1, wherein said parity element-comprises a first parity element, and wherein said data recovery circuit detects an error position of said data using said first parity element and a second parity element of said data read from said memory.

7. The device according to claim 6, wherein said data recovery circuit further comprises:
   a first parity check circuit that makes a parity check of said word and first read parity element; and
   a second parity check circuit that specifies an error position by making a check of a second read parity element of said data read from said memory, if said first parity check circuit finds an error.

8. The device according to claim 7, wherein said read data comprises:
   a word that includes:
      a data element that includes a bit a number of bits of said data element being equal to a number of a bit of said first parity element,
   wherein a data element number is allocated to each data element in said word and to said second parity element, said second parity element with an element number corresponding to said data element with a same data element number,
   wherein:
      said first parity check circuit makes parity checks of said word and said first parity element; and said second parity check circuit specifies an error position by making a check of said data elements and said second parity element, if said first parity check circuit finds an error.

9. The device according to claim 1, wherein said memory includes a semiconductor memory.

10. A device for processing a host data written to a memory, comprising:
- a CRC generator that generates a CRC element from said host data; and
- a parity generator that generates a parity element from said host data;
- wherein a processed host data comprises:
- a word that includes a data element that includes a bit, a number of bits of said data element being equal to a number of a bit of said parity element, a data element number being allocated to each data element in said word and to said CRC element;
- said CRC element with a data element number corresponding to said data element with a same element number; and
- said parity element with respect to said word.

11. A data sector, comprising:
- a word;
- a parity element with respect to said word; and
- a CRC element,
- wherein said word includes:
- a data element that includes a bit, a number of bits of said data element being equal to a number of a bit of a parity element.

12. The data sector according to claim 11, wherein the number of said bits of said data element is equal to a number of a bit of said CRC element.

13. The data sector according to claim 12, wherein the number of said bits of said data element is equal to a number of bits of said word divided by a number of a bit of said parity element.

14. The data sector according to claim 13, wherein the number of the bit of said CRC element is equal to the number of bits of said data element.

15. The data sector according to claim 14, wherein said parity element is defined as: $P(n)=D(wn+0)+D(wn+1)+D(wn+2)+\ldots+D(wn+k)$ P: Parity element D: Data element +: EXOR calculation k: data element number in a word (k=0, 1, 2, ... (w−1)) n: word number (n=0, 1, 2, ... ) w: the number of bytes per one word (w=1, 2, ... ).

16. The data sector according to claim 15, wherein a data element number is allocated to each data element in said word, further comprising:
- a CRC element with a data element number corresponding to said data element with a same data element number.

17. The data sector according to claim 16, wherein a number of bits of the CRC element is equal to the number of bits of said data elements in said word.

18. The data sector according to claim 17, wherein the number of bits of said CRC element is equal to a number of bits of said data element.

19. The data sector according to claim 18, wherein said CRC element is defined as:

$$CRC(k)=D(w*0+k)@D(w*1+k)@D(w*2+k)@\ldots@D(wn+k)$$

CRC: CRC element
D: Data element
@: CRC calculation
k: data element number in a word (k=0, 1, 2, ... (w−1))
n: word number (n=0, 1, 2, ... )
w: the number of bytes per one word (w=1, 2, ... ).

* * * * *